(12) United States Patent
Pelley et al.

(10) Patent No.: US 10,002,653 B2
(45) Date of Patent: Jun. 19, 2018

(54) DIE STACK ADDRESS BUS HAVING A PROGRAMMABLE WIDTH

(71) Applicant: Freescale Semiconductor, Inc., Austin, TX (US)

(72) Inventors: Perry H. Pelley, Austin, TX (US); Michael B. McShane, Austin, TX (US); Tim V. Pham, Austin, TX (US)

(73) Assignee: NXP USA, Inc., Austin, TX (US)

( * ) Notice: Subject to any disclaimer, the term of this patent is extended or adjusted under 35 U.S.C. 154(b) by 143 days.

(21) Appl. No.: 14/525,347

(22) Filed: Oct. 28, 2014

(65) Prior Publication Data

US 2016/0118095 A1    Apr. 28, 2016

(51) Int. Cl.
| | |
|---|---|
| *G11C 8/06* | (2006.01) |
| *H01L 25/065* | (2006.01) |
| *H01L 25/00* | (2006.01) |
| *G06F 13/42* | (2006.01) |
| *G11C 8/12* | (2006.01) |
| *G11C 7/00* | (2006.01) |

(52) U.S. Cl.
CPC ............ *G11C 8/06* (2013.01); *G06F 13/4208* (2013.01); *G11C 8/12* (2013.01); *H01L 25/0657* (2013.01); *H01L 25/50* (2013.01); *G11C 7/00* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,019,943 | A | 5/1991 | Fassbender |
| 5,434,745 | A | 7/1995 | Shokrgozar et al. |
| 5,675,180 | A | 10/1997 | Pedersen et al. |
| 5,998,860 | A | 12/1999 | Chan et al. |
| 6,259,622 | B1 | 7/2001 | Fried et al. |
| 6,281,577 | B1 | 8/2001 | Oppermann et al. |
| 6,337,227 | B1 | 1/2002 | Ball |
| 6,427,156 | B1 | 7/2002 | Chapman et al. |
| 6,603,072 | B1 | 8/2003 | Foster et al. |
| 6,664,485 | B2 | 12/2003 | Bhatt et al. |
| 6,716,676 | B2 | 4/2004 | Chen et al. |
| 7,061,092 | B2 | 6/2006 | Akram et al. |
| 7,198,979 | B2 | 4/2007 | Thomas et al. |
| 7,271,482 | B2 | 9/2007 | Kirby |
| 7,344,969 | B2 | 3/2008 | Tan et al. |
| 7,371,677 | B2 | 5/2008 | Orlowski et al. |
| 7,514,776 | B2 | 4/2009 | Vaiyapuri |
| 7,560,304 | B2 | 7/2009 | Takiar et al. |
| 7,759,800 | B2 | 7/2010 | Rigg et al. |
| 7,777,330 | B2 | 8/2010 | Pelley et al. |
| 7,928,590 | B2 | 4/2011 | Wolter et al. |

(Continued)

OTHER PUBLICATIONS

U.S. Appl. No. 14/158,310, filed Jan. 17, 2014, Pelley et al.

(Continued)

*Primary Examiner* — Michelle Mandala (57) ABSTRACT

The dies of a stacked die integrated circuit (IC) employ the address bus to indicate the particular die, or set of dies, targeted by data on a data bus. During manufacture of the stacked die IC, the IC is programmed with information indicating a width of the address bus. During operation, each die addresses the other dies with addresses having the corresponding width based on this programmed information.

11 Claims, 6 Drawing Sheets

(56) References Cited

U.S. PATENT DOCUMENTS

| | | |
|---|---|---|
| 7,939,920 B2 | 5/2011 | Wallace |
| 8,436,460 B1 | 5/2013 | Gamboa et al. |
| 8,472,232 B2 | 6/2013 | Silvestri |
| 2001/0045645 A1 | 11/2001 | Sasaki et al. |
| 2002/0157082 A1 | 10/2002 | Shau |
| 2002/0182772 A1 | 12/2002 | Moden et al. |
| 2002/0190371 A1 | 12/2002 | Mashino et al. |
| 2003/0080408 A1 | 5/2003 | Farnworth et al. |
| 2003/0106212 A1 | 6/2003 | Chao et al. |
| 2003/0107119 A1 | 6/2003 | Kim |
| 2004/0009631 A1 | 1/2004 | Connell et al. |
| 2004/0069988 A1 | 4/2004 | Lin et al. |
| 2005/0023677 A1 | 2/2005 | Zhao et al. |
| 2005/0051883 A1 | 3/2005 | Fukazawa |
| 2005/0104171 A1 | 5/2005 | Benson et al. |
| 2005/0104183 A1 | 5/2005 | Kuroda et al. |
| 2005/0104219 A1 | 5/2005 | Matsui |
| 2005/0156333 A1 | 7/2005 | Chiou et al. |
| 2006/0216862 A1 | 9/2006 | Rigg et al. |
| 2006/0278979 A1 | 12/2006 | Rangel |
| 2007/0145558 A1 | 6/2007 | Chia et al. |
| 2007/0181998 A1 | 8/2007 | Ha et al. |
| 2008/0001283 A1 | 1/2008 | Lee et al. |
| 2008/0237887 A1 | 10/2008 | Takiar et al. |
| 2008/0284045 A1 | 11/2008 | Gerber et al. |
| 2009/0001543 A1 | 1/2009 | Chung |
| 2009/0001602 A1 | 1/2009 | Chung |
| 2009/0014843 A1 | 1/2009 | Kawashita et al. |
| 2009/0032966 A1 | 2/2009 | Lee et al. |
| 2009/0051043 A1 | 2/2009 | Wong et al. |
| 2009/0085608 A1 | 4/2009 | Alzheimer |
| 2009/0102038 A1 | 4/2009 | Mcelrea et al. |
| 2009/0121615 A1 | 5/2009 | Le Toquin |
| 2009/0194855 A1 | 8/2009 | Liu et al. |
| 2009/0243064 A1 | 10/2009 | Camacho et al. |
| 2009/0302435 A1 | 12/2009 | Pagaila et al. |
| 2010/0007001 A1 | 1/2010 | Wang et al. |
| 2010/0062621 A1 | 3/2010 | Bruennert et al. |
| 2010/0109134 A1 | 5/2010 | Jereza |
| 2010/0109137 A1 | 5/2010 | Sasaki |
| 2010/0123234 A1 | 5/2010 | Chou |
| 2010/0133645 A1 | 6/2010 | Dunne |
| 2010/0213603 A1 | 8/2010 | Smeys et al. |
| 2011/0001240 A1 | 1/2011 | Merilo et al. |
| 2011/0024888 A1 | 2/2011 | Pagaila et al. |
| 2011/0057306 A1 | 3/2011 | McShane et al. |
| 2011/0090004 A1 | 4/2011 | Schuetz |
| 2011/0109381 A1* | 5/2011 | Foster et al. .................. 327/565 |
| 2011/0156233 A1 | 6/2011 | Kim |
| 2011/0175215 A1 | 7/2011 | Farooq et al. |
| 2011/0215355 A1 | 9/2011 | Van De Ven et al. |
| 2011/0316158 A1 | 12/2011 | Chin et al. |
| 2012/0038057 A1 | 2/2012 | Bartley et al. |
| 2012/0113617 A1 | 5/2012 | Kelso et al. |
| 2012/0134193 A1* | 5/2012 | Ide .................................. 365/51 |
| 2012/0201068 A1 | 8/2012 | Ware |
| 2013/0088255 A1 | 4/2013 | Pelley et al. |
| 2013/0091315 A1 | 4/2013 | Ken et al. |
| 2013/0105991 A1 | 5/2013 | Gan et al. |
| 2014/0084444 A1 | 3/2014 | Lin |
| 2014/0264383 A1 | 9/2014 | Kajiwara et al. |

OTHER PUBLICATIONS

U.S. Appl. No. 14/068,637, filed Oct. 31, 2013, Pham et al.
Notice of Allowance, dated Dec. 15, 2015, U.S. Appl. No. 14/068,637, filed Oct. 31, 2013, Pham et al.
Notice of Allowance, dated Feb. 25, 2015, U.S. Appl. No. 13/268,580, filed Oct. 7, 2011, Pelley et al.
Notice of Allowance, dated May 16, 2013, U.S. Appl. No. 13/268,580, filed Oct. 7, 2011, Pelley et al.
Notice of Allowance, dated Nov. 3, 2014, U.S. Appl. No. 13/268,580, filed Oct. 7, 2011, Pelley et al.
Notice of Allowance, dated Sep. 2, 2016, U.S. Appl. No. 14/158,310, filed Jan. 17, 2014, Pelley et al.
Office action, Final Rejection, dated Nov. 5, 2015, U.S. Appl. No. 14/158,310, filed Jan. 17, 2014, Pelley et al.
Office action, Non-Final Rejection, dated Apr. 29, 2016, U.S. Appl. No. 14/158,310, filed Jan. 17, 2014, Pelley et al.
Office action, Non-Final Rejection, dated Aug. 27, 2015, U.S. Appl. No. 14/068,637, filed Oct. 31, 2013, Pham et al.
Office Action, Non-Final Rejection, dated Jan. 17, 2013, U.S. Appl. No. 13/268,580, filed Oct. 7, 2011, Pelley et al.
Office action, Non-Final Rejection, dated Jun. 16, 2014, U.S. Appl. No. 13/268,580, filed Oct. 7, 2011, Pelley et al.
Office action, Restriction, dated Mar. 24, 2015, U.S. Appl. No. 14/068,637, filed Oct. 31, 2013, Pham et al.
Office Action, Restriction, dated Nov. 23, 2012, U.S. Appl. No. 13/268,580, filed Oct. 7, 2011, Pelley et al.
U.S. Appl. No. 13/268,580, filed Oct. 7, 2011, Pelley et al.

* cited by examiner

DIE STACK ADDRESS BUS HAVING A PROGRAMMABLE WIDTH

BACKGROUND

Field of the Disclosure

The present disclosure relates generally to integrated circuits and, more particularly, to integrated circuits employing a die stack.

Description of the Related Art

Traditionally, integrated circuit (IC) performance has been improved by scaling the number of components integrated into a single semiconductor die. However, because of power density constraints, limitations on interconnect scaling, and other physical limitations, it is increasingly difficult to further improve performance by scaling an individual die. Accordingly, integrated circuit designers have turned to "three-dimensional" integrated circuit arrangements, wherein multiple dies are stacked on top of each other. These stacked die designs provide many benefits, including small footprints, improved yields, and better performance. However, each die in the stack must be configured to work with each other die, increasing manufacturing, warehousing, and other production costs.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-8 illustrate techniques for providing a stacked die IC having a die address bus having a programmable width. The dies of the stacked die IC employ the address bus to indicate the particular die, or set of dies, targeted by data on a data bus. During manufacture of the stacked die IC, the IC is programmed with information indicating a width of the address bus. During operation, each die in the die stack has a common address bus width. This allows the die stack to be configured in different ways for different devices or intended uses, without the need to redesign each die.

To illustrate, in at least one embodiment the dies in the stacked die IC are memory devices stacked on top of a die incorporating a memory controller. For one type of consumer product incorporating the IC, it is desirable that each of the memory dies be individually addressable, and data exchanged between the dies and the memory controller via an N-bit wide data bus. For a different type of consumer product, it is desirable that the memory dies be configured in sets of pairs, thereby allowing each set to exchange data with the memory controller using a 2N-bit wide bus. Because of the different configuration of the die stacks, the die address bus for each configuration is different. Conventionally, in order to accommodate the different bus widths, different dies would be designed and manufactured for each of the different configurations. Using the techniques described herein, the same dies could be used in either configuration, thereby reducing production costs.

In at least one embodiment, each die in the stacked die IC is formed to include TSVs that, when the dies are stacked together, form a data bus that traverses the die stack. Different subsets of the TSVs form respective subsets of the data bus. For example, the data bus can be 32 bits wide grouped into four subsets of eight bits each. Each die includes thirty-two TSVs for the data bus, grouped into four subsets of eight TSVs each, corresponding to the 4 subsets of the data bus. Each die is formed so that the subsets of TSVs are arranged symmetrically about two centerlines of a top face of the die. The same corresponding subset of data bus TSVs are connected to a corresponding functional module of each die. Because of the symmetrical arrangement of the TSVs, different data bus widths can be formed by different arrangements of the orientation of each die in the stack. For example, if each TSV subset includes N TSVs, an N-bit wide data bus can be formed by stacking each die with the top face pointing in the same direction. A 2N-bit wide data bus can be formed by grouping the dies into pairs, and flipping one die of each pair so that the top faces of each pair of dies face each other. A 4N-bit wide data bus can also be formed, as described further herein. The symmetrical arrangement of the TSVs, together with the die address bus having a programmable width, allows for the dies to be used in a wide variety of configurations, improving die flexibility and reducing production costs.

Figure 1:
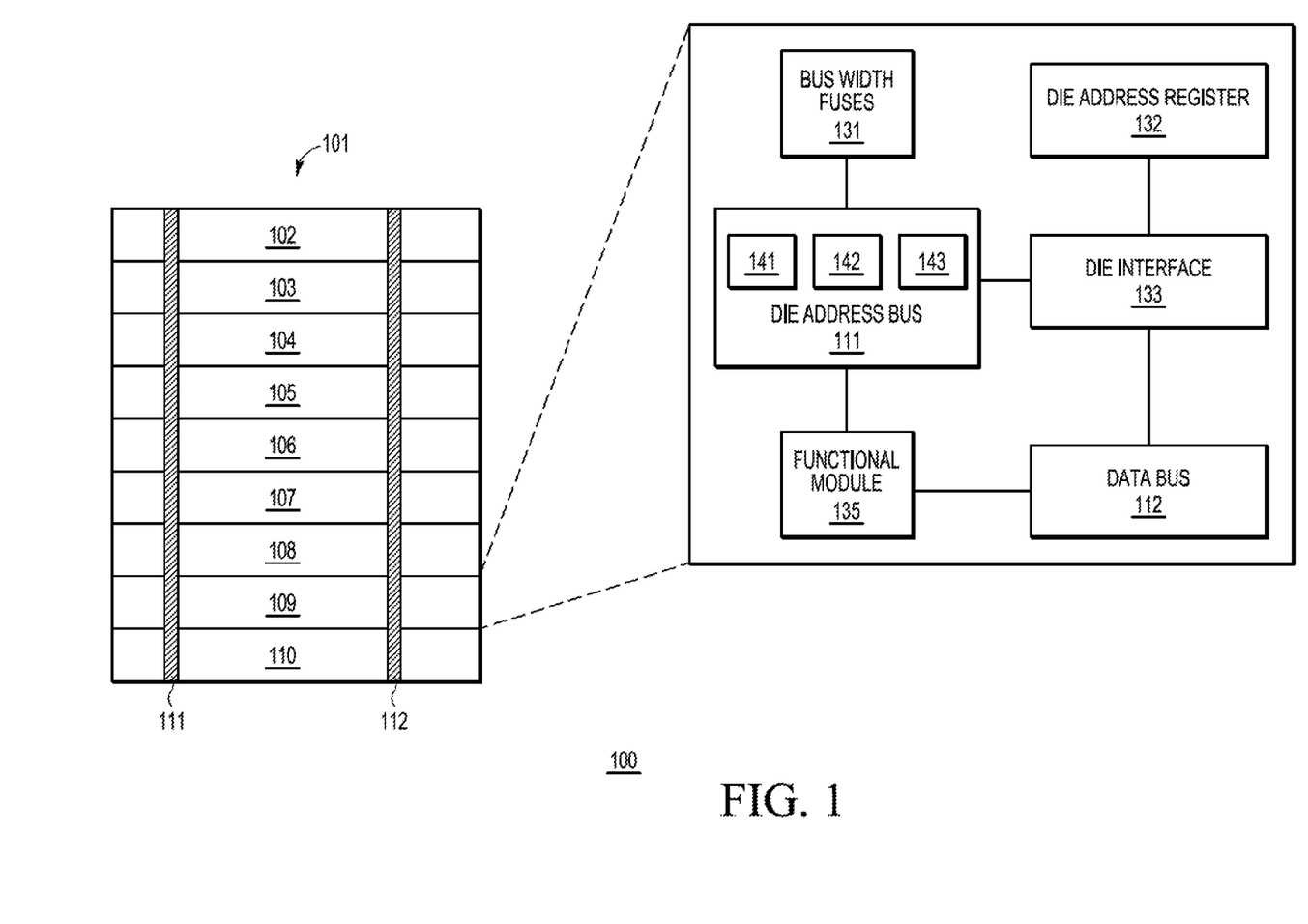
FIG. 1 is a block diagram of a stacked die IC having a die address bus with a programmable width in accordance with at least one embodiment of the present disclosure.

FIG. 1 illustrates a block diagram of a stacked die IC 100 in accordance with one embodiment of the present disclosure. The stacked die IC 100 is an integrated circuit device including a die stack 101 having dies 102-110. In the illustrated example, the die stack 101 is formed with die 110 at the bottom, die 109 stacked on die 110, die 108 stacked on die 109, die 107 stacked on die 108, and so on, with die 102 stacked on die 103 and forming the top of the stack 101. Each of the dies 102-110 is a semiconductor die including transistors and other components connected so that they form one or more circuits that perform functions for the stacked die IC 100. In at least one embodiment, each of the dies 102-108 is formed at a different semiconductor wafer. The wafers are then aligned, bonded, and singulated into individual stacks, including the stack 101. In another embodiment the dies 102-110 can be formed at the same wafer, or at different wafers, singulated, and then stacked.

In at least one embodiment the modules of the die 110 form a general purpose processor, including an instruction pipeline for execution of instructions, cache memory for storage of information for the instruction pipeline, and other processor modules. The modules of the dies 102-109 are memory modules to provide system memory for the processor at the die 110. Accordingly, the dies 102-109 can include storage arrays, address decode modules, and the like, to provide memory storage functionality for the stacked die IC 100. In some embodiments more or less memory may be stacked on die 110.

The dies 102-110 can be connected via one or more interconnections (e.g., through silicon vias, or TSVs). In the illustrated example, the dies 102-110 are connected via a die address bus 111 and a data bus 112 each bus comprising multiple TSVs. Together, the busses 111 and 112 carry information that allows the die 110 to communicate messages, such as memory access requests, to one or more of the dies 102-109. In particular, each of the dies 102-110, or each subset of the dies, is assigned a corresponding die address. The assignment can occur during manufacture of the die stack or by some other method. To communicate a message to a die, or subset of dies, the die 110 places the corresponding address on the die address bus 111 and the content of the message (e.g., memory address information, write data, and the like) on the data bus 112. As described further herein, the die or subset of dies corresponding to the indicated address receive and process the message content, or a portion thereof. In some cases, in response to a message (e.g., a read access request), the die or subset of dies may return data to the die 110 via the data bus 112. It will be appreciated that, in some embodiments, each die or subset of dies can communicate messages, and responsive messages or data, to any other of the dies or subset of dies of the die stack 101. For purposes of description, it will be assumed that die 110 generates messages for provision to the dies 102-109.

Though the number of address TSVs is set by the die design and remains unchanged during operation, die address bus 111 has a programmable active width (in the following referred to simply as width) which determines whether all or only a subset of the address TSVs will be used to communicate addresses to die in the die stack. In at least one embodiment, the die address bus 111 includes a number of signal paths, or lines, with each signal line corresponding to a bit of information to be communicated in parallel via the bus. The width of the die address bus 111 indicates the number of signal lines of the bus that convey information. In at least one embodiment, the die address bus includes N signal lines, so that it has a maximum width of N bits. During manufacture of the die stack 101, a designer determines a specified width of the die address bus 111. As described further herein, a wafer probe or other device stores the specified width at one or more of the dies 102-110. For example, each of the dies 102-110 can include a set of fuses or other non-volatile medium that are programmed by the wafer probe to store the specified width. The programming of dies 102-110 ensures that the addresses placed on the die address bus 111 by die 110 and received by die 102-109 match the specified width. In particular, if the specified width is less than N, the dies 102-110 ensure that only the specified number of signal lines are provided with useful information or are read by each die. For example, it at least one embodiment each of the dies 102-110 adjusts the width of the die address bus 111, based on the specified width, by coupling one or more of the signal lines to a specified voltage reference (e.g., ground) so that the signal lines cannot communicate useful information. In another embodiment, each of the dies 102-110 adjusts the width of the die address bus to the specified width by masking data received via the die address bus 111, so that the bus effectively conveys addresses only of the specified width.

In at least one embodiment, the die address bus 111 comprises a fixed portion for addressing data within a memory die 102-109 and a programmable portion for addressing one or more die 102-109. The width of the portion for addressing data within a memory is fixed by design. The programmability of the width of the die address bus 111 allows the die stack 101 to be configured in various arrangements without redesign or extensive adjustment of each die. For example, in one configuration the die stack 101 can include 8 memory dies (e.g., dies 102-109) stacked on a processor or memory controller (e.g., die 110), similar to the configuration illustrated in FIG. 1. In this configuration, each of the 8 memory dies is assigned a corresponding 3-bit die address, and the assigned address and the width of die selection portion of die address bus 111 is programmed to have a width of 3-bits. In another configuration, the die stack 101 can include only 4 memory dies stacked on the processor or memory controller, thereby reducing the overall cost and size of the stack. In this configuration each of the 4 memory dies is assigned a corresponding 2 bit address, and the die address bus 111 is programmed to have a width of 2-bits. Because of the programmability of the width of the die address bus 111, the same memory dies can be used in the 8-die configuration and the 4-die configuration, reducing production costs.

Figure 2:
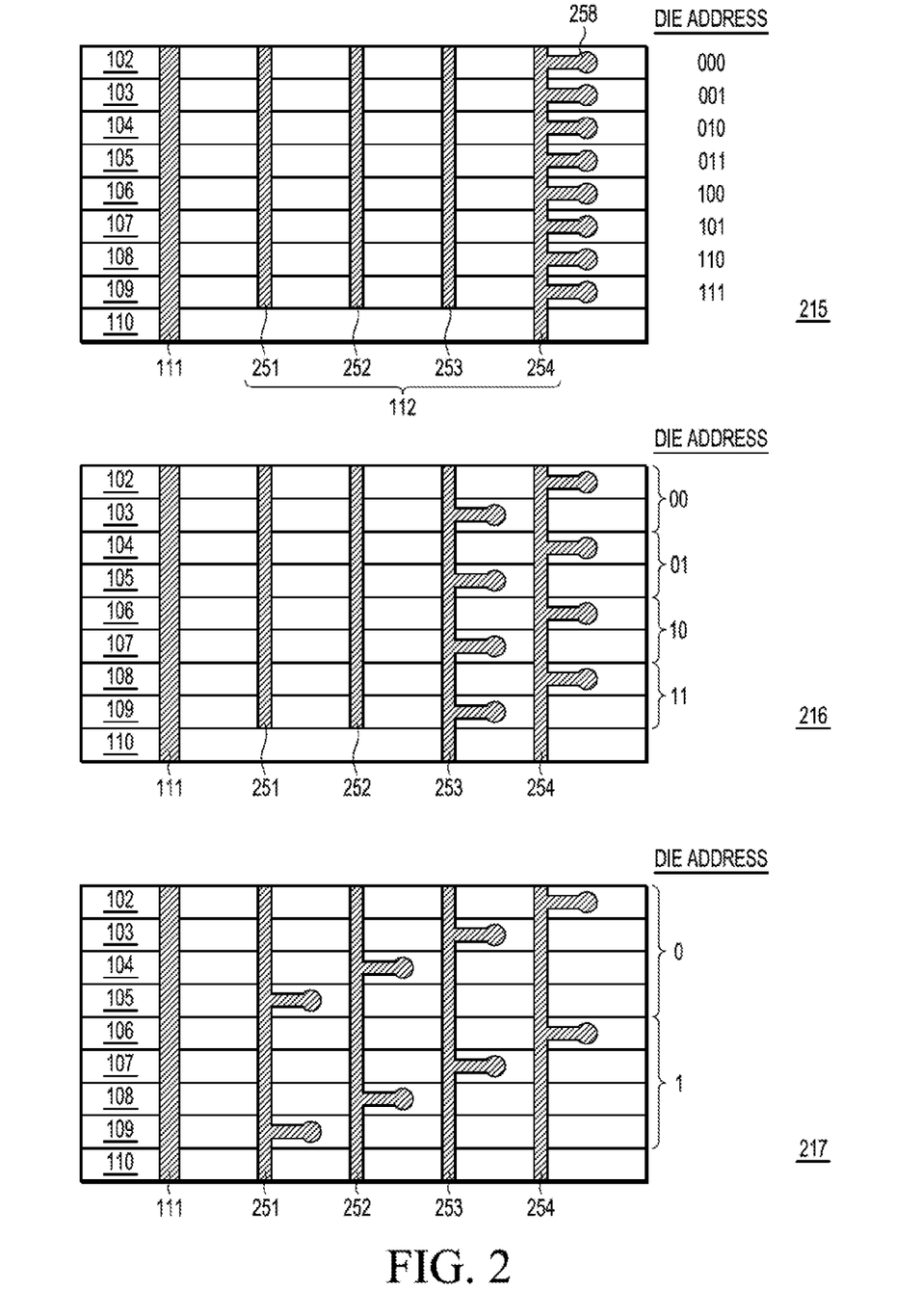
FIG. 2 is a block diagram illustrating different configurations of a data bus of the stacked die IC of FIG. 1 in accordance with at least one embodiment of the present disclosure.

In some embodiments, as described further herein with respect to FIG. 2, the dies 102-109 can be grouped into subsets, with each subset of dies assigned and each die of the subset programmed with a corresponding die address. By forming the data bus 112 of sufficient size, this grouping, and the programmability of the width of the die address portion of bus 111, allows the die stack to be placed in a variety of different configurations without requiring a redesign of the individual dies or changing the number of dies in the stack 101.

The die 109 includes bus width fuses 131, a die address register 132, a die interface 133, and a functional module 135. The functional module 135 is one or more circuits arranged to perform one or more specified functions, such as data storage, input/output signal control and conditioning, instruction execution, and the like. The bus width fuses 131 are a set of fuses that are programmed, during production of the die 109, with a value indicating the width of the die address bus 111. The die address register 132 is a storage structure that is programmed, during production of the die 109 or some other initialization procedure, with the die address of the die 109. The die interface 133 is one or more modules that provide an interface between the functional module 135, the buses 111, 112, and the die address register 132.

In the depicted example, the die address portion of die address bus 111 includes three signal lines, designated signal lines 141, 142, and 143. In operation, to communicate a message to a targeted one of the dies 102-109, a module of the die 110 places the address of the targeted die on the signal lines 141-143 of the die address bus 111. In addition, the module of the die 110 places the message on the data bus 112. The die interface 133 determines, based on the bus width fuses 131, which of the signal lines 141-143 carry the die address provided by the die 110. For example, in one embodiment the bus width fuses 131 store a binary value of 10*b*, indicating that the die address is 2 bits wide. In response, the die interface 133 determines that the bus address is represented by signals on signal lines 142 and 143, and that data on signal line 141 can be ignored. The die interface 133 can therefore identify the bus address by masking data on signal line 141, by connecting the signal line 141 to a fixed voltage reference that matches a corresponding bit of the die address register, and the like.

The die interface 133 compares the received die address, of the identified address width, to the value programmed into the die address register 132. In response to identifying a mismatch, the die interface 133 uncouples the data bus 112 from the functional module 135, so that the message on the data bus 112 is not provided to the functional module 135. In response to determining that the die address one the die address bus matches the value stored at the die address register 132, the die interface 133 couples the data bus 112 to the functional module 135, thereby providing the message from the die 109 to the functional module 135.

In at least one embodiment, the internal busses of the functional modules of the dies 102-109 are of a size M. By forming and stacking the dies 102-110 so that the data bus 112 is greater than M (e.g., 4M), the die stack 101 can be configured in a variety of different ways for different devices. This can be better understood with reference to FIG. 2, which illustrates configurations 215, 216, and 217 of die stack 101 in accordance with at least one embodiment. In the depicted example, the data bus 112 includes four sub-busses, designated sub-busses 251, 252, 253, and 254. Each sub-bus is an equivalently sized portion of data bus 112. For purposes of description, it is assumed that the data bus 112 is 32 bits wide, and each of the sub-busses is 8 bits wide. However, it will be appreciated that the data bus 112 and each of the sub-busses 251-254 can be of different sizes than in the described example.

The different configurations 215-217 use different ones of the sub-busses 251-254 to deliver data to their respective functional modules. In the depicted example, a connection to a functional module of a die is illustrated by a vertical line with a circle on its right end. For example, connection 258 of configuration 215 indicates that the functional module of die 102 is connected to sub-bus 254.

As illustrated by FIG. 2, in configuration 215 all of the functional modules of the dies 102-109 are connected to the sub-bus 254. Thus, in configuration 215 the data bus 112 is effectively an 8-bit wide bus that uses only sub-bus 254. In addition, in configuration 215 each of the dies 102-109 is individually addressable with a different 3 bit die address. Accordingly, in configuration 215 the die address bus 111 is programmed to have a width of 3 bits.

In configuration 216, the dies 102-109 are grouped in pairs. The functional module of one of the dies of each pair is connected to sub-bus 254 while the functional module of the other die of each pair is connected to sub-bus 253. For example, dies 102 and 103 are grouped into one pair, wherein the functional module of die 102 is connected to sub-bus 254 and the functional module of die 103 is connected to sub-bus 253. Thus, in configuration 216 the data bus 112 is effectively a 16-bit wide bus that uses only sub-busses 253 and 254. In addition, in configuration 216 each grouped pair of the dies 102-109 is individually addressable with a different two-bit die address. Accordingly, in configuration 215 the die address bus 111 is programmed to have a width of two bits.

In configuration 216, the dies 102-109 are grouped in sets of four, wherein the functional module of each die in each set is connected to a respective different one of the sub-busses 251-254. For example, dies 102-105 are grouped into one set, wherein the functional module of die 102 is connected to sub-bus 254, the functional module of die 103 is connected to sub-bus 253, the functional module of die 104 is connected to sub-bus 252, and the functional module of die 105 is connected to sub-bus 251. Thus, in configuration 216 the data bus 112 is effectively a 32-bit wide bus that uses all of the sub-buses 251-254. In addition, in configuration 216 each grouped set of the dies 102-109 is individually addressable with a different 1 bit die address. Accordingly, in configuration 215 the die address bus 111 is programmed to have a width of one bit.

The different configurations 215-217 can be used for different configurations of the die 110. For example, in at least one embodiment the die 110 includes a memory controller, and the functional modules of the dies 102-109 are memory modules that can be accessed (read and written) by memory access requests issued by the memory controller. In one configuration, the memory controller employs an 8 bit wide internal bus, so that it accesses portions of the memory modules 8 bits at a time. For this configuration, the die stack 101 can be arranged in configuration 215.

In another configuration, the memory controller employs a 16 bit wide internal data bus, so that it accesses portions of the memory modules 16 bits at a time. For this configuration, the die stack 101 can be arranged in configuration 216. In this configuration, each memory access is partially satisfied by each die in the addressed pair. For example, for a write access to a memory location, one die in the addressed pair stores half of the write data and the other die in the addressed pair stores the other half. For a read access to the memory location, one die in the addressed pair provides half of the read data and the other die in the addressed pair provides the other half.

In a third configuration, the memory controller employs a 32 bit wide internal data bus, so that it accesses portions of the memory modules 32 bits at a time. For this configuration, the die stack 101 can be arranged in configuration 217. In this configuration, each memory access is partially satisfied by each die in the addressed group, in similar fashion to that described above with respect to configuration 215, but with each die in the group storing or providing one-fourth of the write or read data. Thus, the die stack 101 can be configured in various arrangements without requiring a specialized die for each configuration, reducing design and production costs.

The configurations 215-217 can be realized in different ways. In at least one embodiment, each of the functional modules of each of the dies 102-109 is connected to all of the sub-busses 251-254 via corresponding fuses. During a programming stage of manufacture, the fuses of the dies are programmed such that the functional modules of each die are connected to the appropriate sub-bus. In this embodiment an interface for each bit of the data bus must be provided and along with switches to direct data to the appropriate bit of the data bus depending on the programmed die address bus width and the programmed die address. Unused interfaces to the data bus are tri-stated. In at least one other embodiment, each of the dies 102-109 is formed with sets of TSVs to cumulatively support the width of the widest data bus programmable option. Only one of the subset or port of a subset of TSVs is connected by design to the functional module of the die address programmable die, and the configurations 215-217 can be formed by appropriately orienting each die in the die stack 101. This can be better understood with reference to FIGS. 3-5.

Figure 3:
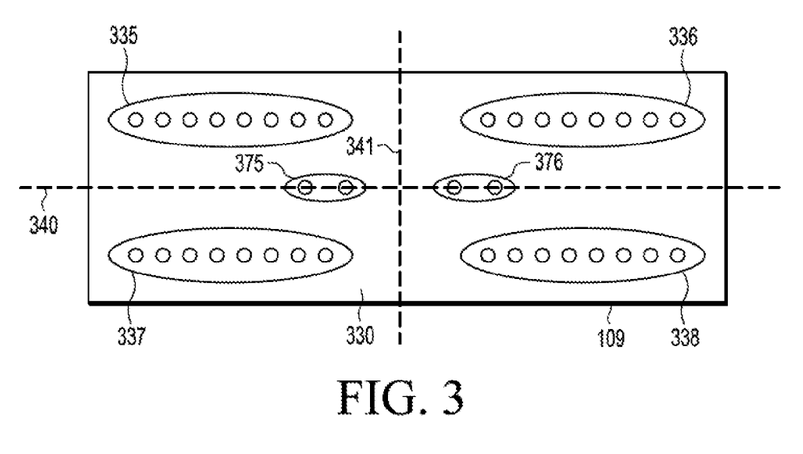
FIG. 3 is a diagram illustrating an arrangement of through-silicon vias (TSVs) at a die of the stacked die IC of FIG. 1 in accordance with at least one embodiment of the present disclosure.

FIG. 3 illustrates a top-view diagram of the die 109 in accordance with at least embodiment of the present disclosure. The die 109 includes a top face 330 opposite a bottom face (not shown). It will be appreciated that the terms "top face" and "bottom face" refer to relative positions of faces of the die 109, and do not necessarily refer to any particular orientation of the faces in space. The die 109 also includes TSV sets 335, 336, 337, and 338, each including 8 TSVs. When the die 109 is stacked in the die stack 101, each of the TSV sets 335-338 forms a portion of a corresponding one of the sub-busses 251-254. Further, only the TSVs of set 335 are connected to the functional module of the die 109. The sets 336, 338, 337 of TSVs are electrically isolated from die 109.

In the depicted example, the top face of the die 109 is symmetrical about two orthogonal centerlines, designated centerline 340 and centerline 341, respectively. Centerline 340 runs through the center of the top face 330 parallel to the perimeter of the top face 330 in one direction (the "horizontal" direction in the depicted example). Centerline 341 is orthogonal to centerline 340, and runs through the center of the top face 330 parallel to the perimeter of the top face 330 in a direction orthogonal (the "vertical" direction in the depicted example) to that of the centerline 340.

The sets 335-338 of TSVs are arranged symmetrically about the centerlines 340 and 341. In the depicted example, TSV set 335 is above centerline 340 and to the left of centerline 341, TSV set 336 is above centerline 340 and to the right of centerline 341, TSV set 337 is below centerline 340 and to the left of centerline 341, and TSV set 335 is below centerline 340 and to the right of centerline 341. Further the die 109 is formed so that each of the TSV sets 335-338 is the same respective distance from each of the centerlines 340 and 341. This allows the die 109 to be rotated about either of the centerlines 340 and 341 while ensuring that the TSV sets 335-338, in any of the rotated positions for a portion of one of the sub-busses 251-254. For example, in one orientation the die 109 is not rotated, so that the top face 330 faces towards a top of the die stack 101. In this orientation, TSV set 335 forms a portion of sub-bus 254, TSV set 336 forms a portion of sub-bus 252, TSV set 337 forms a portion of sub-bus 253, and TSV set 338 forms a portion of sub-bus 251. In another orientation the die 109 is rotated about the centerline 340, such that the top face 330 faces towards a bottom of the die stack 101. In this orientation, the TSV set 335 is in the "bottom, left" portion of the face 330 when viewed from the top (i.e., in the position formerly occupied by TSV set 337 prior to rotation). In this orientation, TSV set 335 forms a portion of sub-bus 253, TSV set 336 forms a portion of sub-bus 251, TSV set 337 forms a portion of sub-bus 254, and TSV set 338 forms a portion of sub-bus 252.

In the illustrated example, die 109 also includes additional TSVs, such as TSVs 375 and 376 that provide signal lines (or portions thereof) for control signals such as, clock signals, write enable signals, and the like. TSVs 376 are placed on the centerline 340 with corresponding TSVs 376 mirrored about centerline 341. TSVs 376 are each internally coupled to a corresponding TSV of TSVs 376 so that a die with any die orientation relative to die 109 will have a set of control signal TSVs coupled to the appropriate TSV of TSVs 375 of die 109, thus forming a signal path for the associated control signal through the die stack 101. In other embodiments, the TSVs 375 and 376 can form signal paths for signals other than control signals.

As indicating above, rotating the die 109 about the centerlines 340 and 341 changes which of the TSV sets 335-338 forms a corresponding portion of each of the sub-busses 251-254. Further, because only TSV set 335 is connected to the functional module of the die 109, rotating the die effectively changes which of the sub-busses 251-254 is connected to the functional module. Accordingly, by setting each of the dies 102-109 in the appropriate position prior to stacking, any of the configurations 215-217 of FIG. 2 can be created. For example, configuration 215 can be created by placing each of the dies 102-109 in a similar position of die 109 of FIG. 3, such that their respective top faces all face towards a top of the die stack 101. In this configuration, all of the functional modules of the dies 102-109 are connected to the same sub-bus of data bus 112, as in configuration 215.

Figure 4:
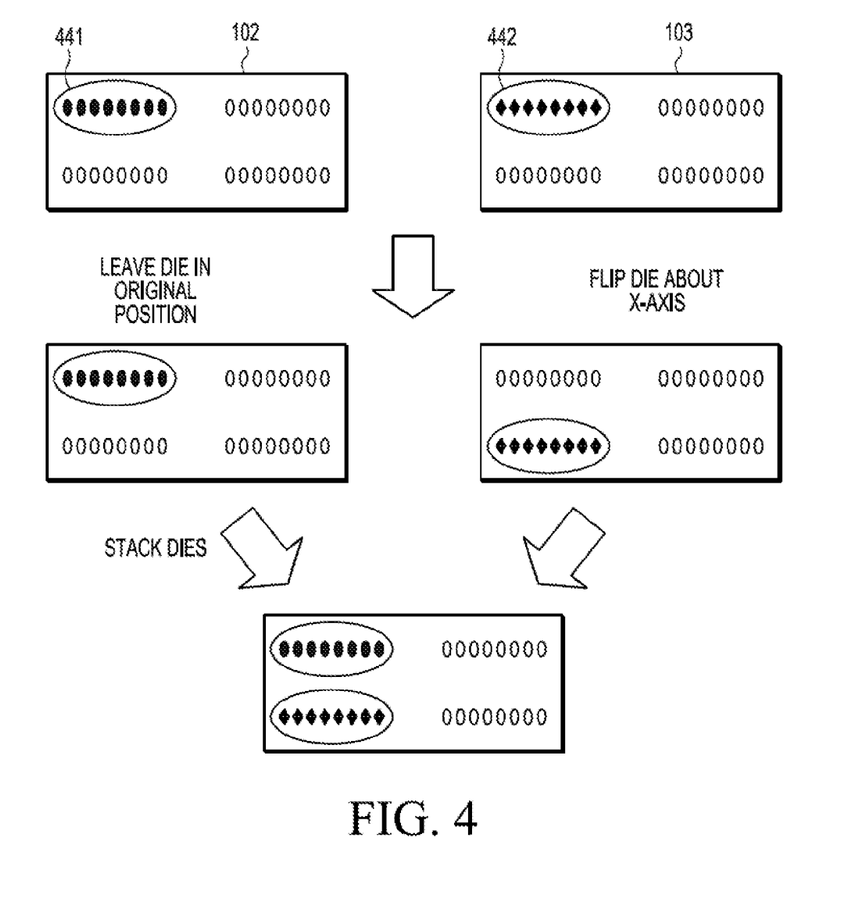
FIG. 4 is a diagram illustrating a technique to stack dies of the stacked die IC of FIG. 1 in order to align TSVs of the dies in accordance with at least one embodiment of the present disclosure.

FIG. 4 illustrates an arrangement of a pair of dies in a configuration corresponding to configuration 216 of FIG. 2 in accordance with at least one embodiment of the present disclosure. The illustrated example illustrates identical dies 102 and 103 from a top position, similar to the view of die 109 of FIG. 3. The dies 102 and 103 are each formed similarly to the die 109 of FIG. 3 to each have four TSV sets arranged symmetrically about their respective centerlines. Die 102 includes a TSV set 441, indicated by black circles, which is connected to the functional module of die 102. In a similar position (assuming the top faces of each die face in the same direction), die 103 includes a TSV set 442, indicated by black diamonds, which is connected to the functional module of die 103. In the depicted example, the die 103 is flipped about its centerline so that its top face faces in an opposite direction to the top face of die 102. When viewed from the top of the die stack 101, this places the TSV set 442 below the TSV set 441, so that, when stacked in the die stack 101, the TSV sets 441 forms a portion of the sub-bus 254 while TSV set 442 forms a portion of the sub-bus 253. Thus, by leaving die 102 in one position while flipping or rotating the die 103 to the different position illustrated at FIG. 4, the respective functional modules of each die are connected to different ones of the sub-busses 253 and 254, as illustrated by configuration 216 of FIG. 2. Other pairs of dies, as illustrated by configuration 216, can be similarly arranged. Thus, different configurations can be created by differently positioning different dies, obviating the need to program the sub-bus connections for each die or have a specially designed die for each possible sub-bus connection.

Figure 5:
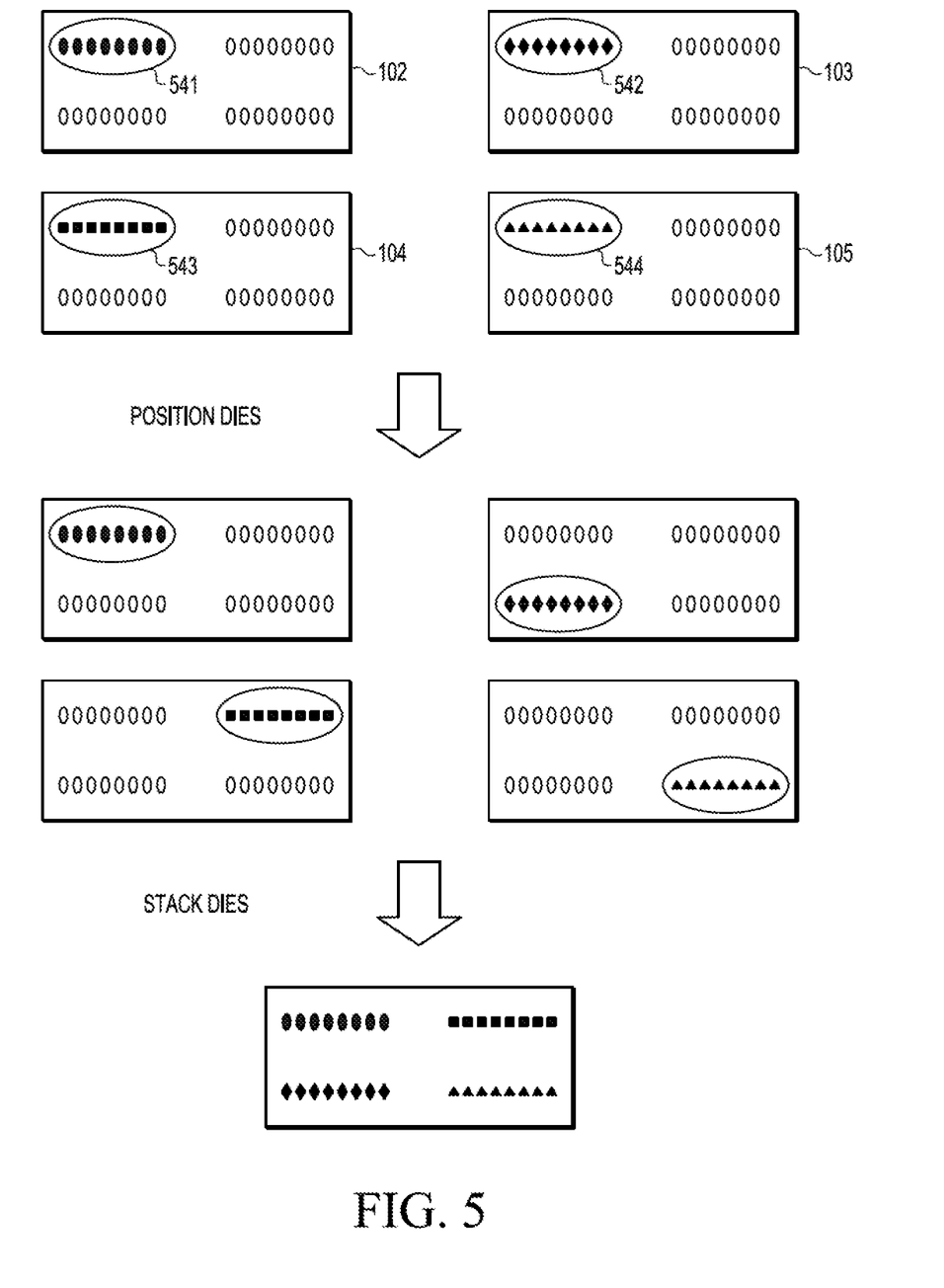
FIG. 5 is a diagram illustrating another technique to stack dies of the stacked die IC of FIG. 1 in order to align TSVs of the dies in accordance with at least one embodiment of the present disclosure.

FIG. 5 illustrates an arrangement of a set of four dies in a configuration corresponding to configuration 217 of FIG. 2 in accordance with at least one embodiment of the present disclosure. The illustrated example illustrates dies 102, 103, 104, and 105 from a top position, similar to the view of die 109 of FIG. 3. The dies 102-105 are each formed similarly to the die 109 of FIG. 3 to each have four TSV sets arranged symmetrically about their respective centerlines. Die 102 includes a TSV set 541, indicated by black circles, which is connected to the functional module of die 102. In a similar position (assuming the top faces of each die face in the same direction), die 103 includes a TSV set 542, indicated by black diamonds, which is connected to the functional module of die 103. Die 104 includes a TSV set 543, indicated by black squares, which is connected to the functional module of die 104, and die 105 includes a TSV set 544, indicated by black triangles, which is connected to the functional module of die 105. The dies 102-105 are identical, including programming of the die address bus width at each die.

In the depicted example, the die 103 is flipped about its horizontal centerline so that its top face faces in an opposite direction to the top face of die 102. Dies 104 is rotated 180 degrees to position the TSV set 543 as illustrated at FIG. 4. Die 105 is rotated 180 degrees and then flipped to position the TSV set 544 as illustrated at FIG. 4. After flipping and rotating, when viewed from the top of the die stack 101, the TSV set 542 is below the TSV set 541, TSV set 543 is to the right of TSV set 541, and TSV set 544 is below TSV set 543 and to the right of TSV set 542. Accordingly, when dies 102-105 are stacked in the die stack 101, the TSV sets 541 forms a portion of the sub-bus 254, TSV set 542 forms a portion of the sub-bus 253, TSV set 543 forms a portion of the sub-bus 252, and TSV set 544 forms a portion of the sub-bus 251. By positioning the dies in this way, the respective functional modules of each die are connected to different ones of the sub-busses 251-254, as illustrated by configuration 217 of FIG. 2. The other group of four dies illustrated by configuration 216 can be similarly arranged.

Figure 6:
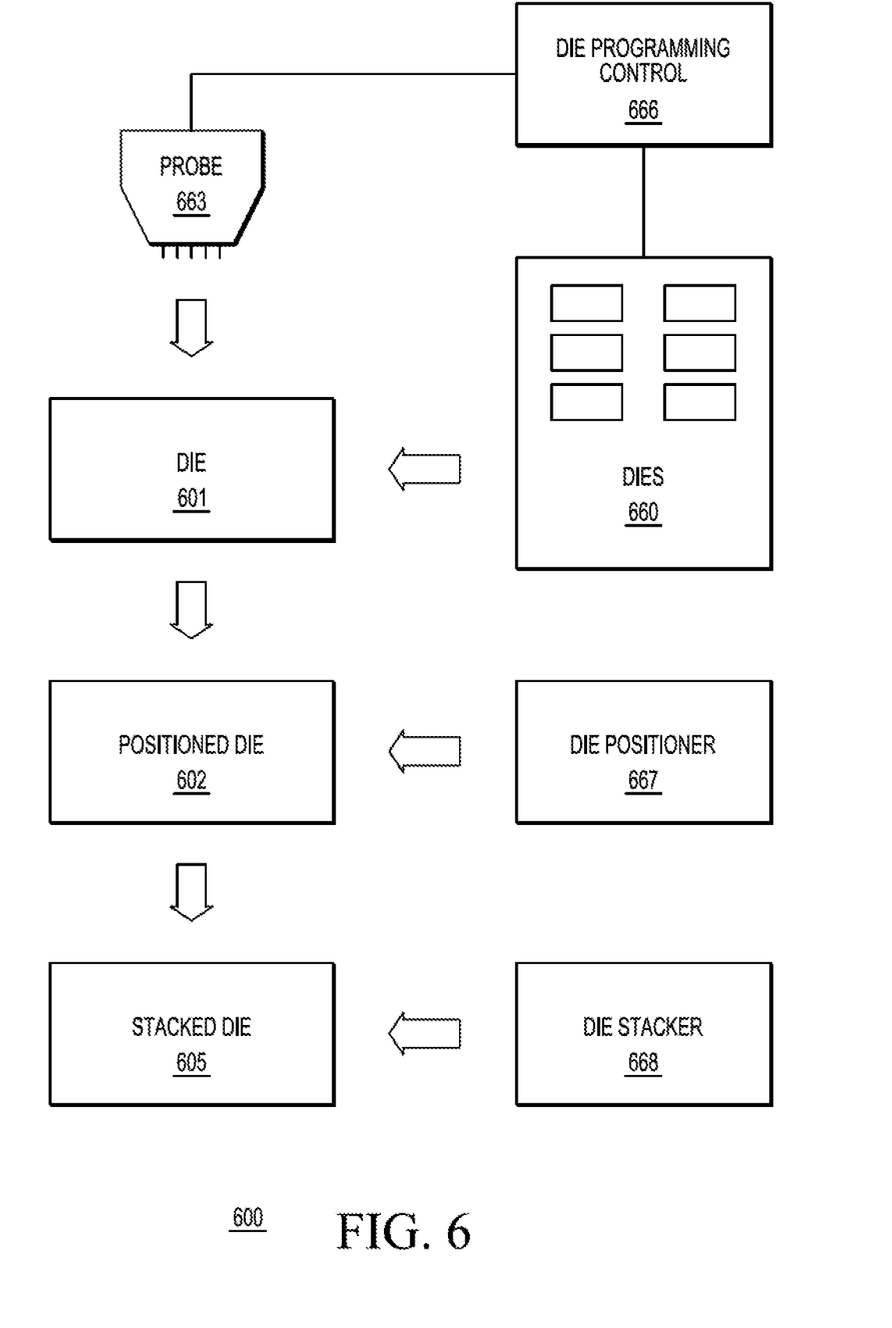
FIG. 6 is a block diagram of a system for stacking dies in a stacked die IC and programming a die address bus width of the stacked die IC in accordance with at least one embodiment of the present disclosure.

FIG. 6 is a block diagram of a die stacking system 600 in accordance with at least one embodiment of the present disclosure. The system 600 includes a die programming control module 666 connected to a probe 663. The die programming control module 666 is a computer device, and associated manufacturing equipment, generally configured to select one or more dies from a set 660 of dies based on a design specification, computer readable control file, or other design information (not shown). In the illustrated example, the die programming control has selected a die 601. In at least one embodiment, the die 601 is part of a semiconductor wafer including multiple dies. In at least one other embodiment the die 601 is an individual die that has previously been singulated from a semiconductor wafer.

The probe 663 is manufacturing equipment configured to apply electrical signaling to terminals of the die 601 in order to program fuses or otherwise store configuration data at storage modules of the die 601. In operation, the die programming control module 666 accesses design information to identify the values that are to be programmed at one or more storage modules (e.g., one or more fuses) of the die 601. The die programming control module 666 controls the probe 663 to apply the electrical signaling to program the identified values at the corresponding storage modules of the die 601. As part of this programming, the die programming control module 666 identifies, based on the design information, the width of the die address bus for the die 601, and controls the probe 663 to program a value indicating the bus width at die address register of the die 601. The die programming control module 666 can also program the die 601 with information indicating the die address assigned to the die 601.

The system 600 includes a die positioner 667 and a die stacker 668. The die positioner 667 includes a computer device and associated equipment to rotate the die 601, resulting in a positioned die 602. In at least one embodiment, the die positioner 667 rotates the die 601 to align a set of TSVs connected to a corresponding functional module with the TSV sets of one or more other dies (not shown) so that the functional module of the die 601 is connected to a sub-bus of a data bus, in similar fashion to that described above with respect to FIGS. 2-5. The die stacker 668 stacks the positioned die, together with other positioned die, into a stacked die 605. The die stacker 668 can include equipment to ensure that the dies to be stacked are aligned, equipment to place each die on the stack in its specified position, and equipment to bond the die to each other.

In at least one embodiment, the system 600 performs its operations on semiconductor wafers including multiple dies. The system 600 programs the die address bus width and the same die address value at each die on the wafer, then positions the wafer such that each die of the wafer has the same orientation. The system 600 stacks the wafer with other programmed and positioned wafers, resulting in multiple stacked die arrangements. The system 600 can then singulate the stacked dies from the wafers.

In at least one other embodiment, the system 600 performs its operations on a single semiconductor wafer. In particular, the system 600 programs the die address bus width and a different die address value at each die on the wafer. The system 600 then singulates the dies on the wafer, positions the singulated dies as described with respect to FIGS. 2-5 according to a specified configuration, and stacks the positioned dies.

Figure 7:
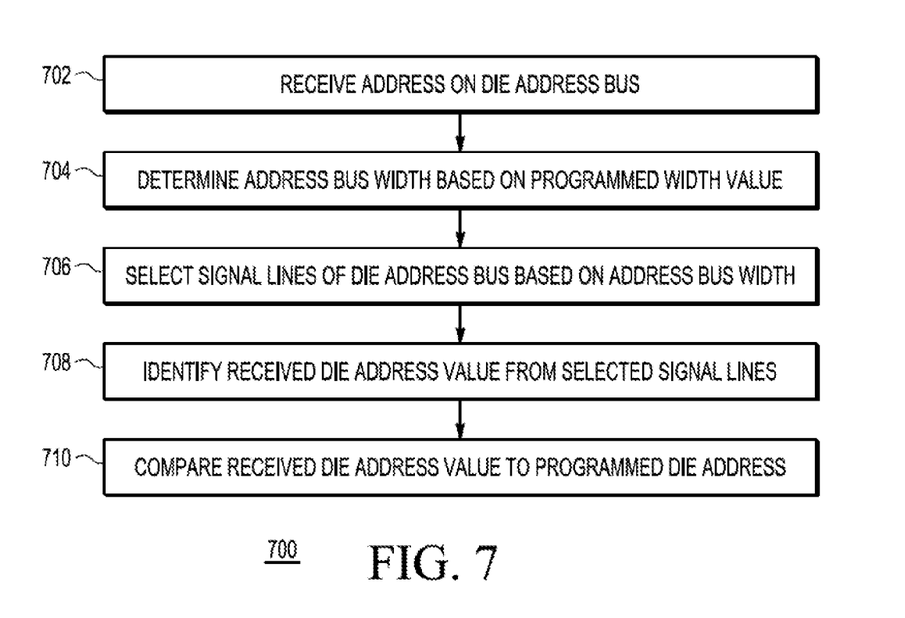
FIG. 7 is a flow diagram of a identifying a die address bus width in accordance with at least one embodiment of the present disclosure.

FIG. 7 illustrates a method 700 of identifying a bus address at a die of a stacked die IC in accordance with at least one embodiment of the present disclosure. At block 702 the die receives an address at a die address bus of the stacked die IC, the address corresponding to a message on a data bus of the stacked die IC. At block 704 the die determines, based on a set of programmed fuses, a width of the die address bus. At block 706 the die identifies, based on the width of the die address bus, which signal lines of the die address bus the die address is to be read from. At block 708 the die reads the address from the identified signal lines. At block 710 the die compares the read die address to a stored die address value to determine if the message is targeted to the die.

Figure 8:
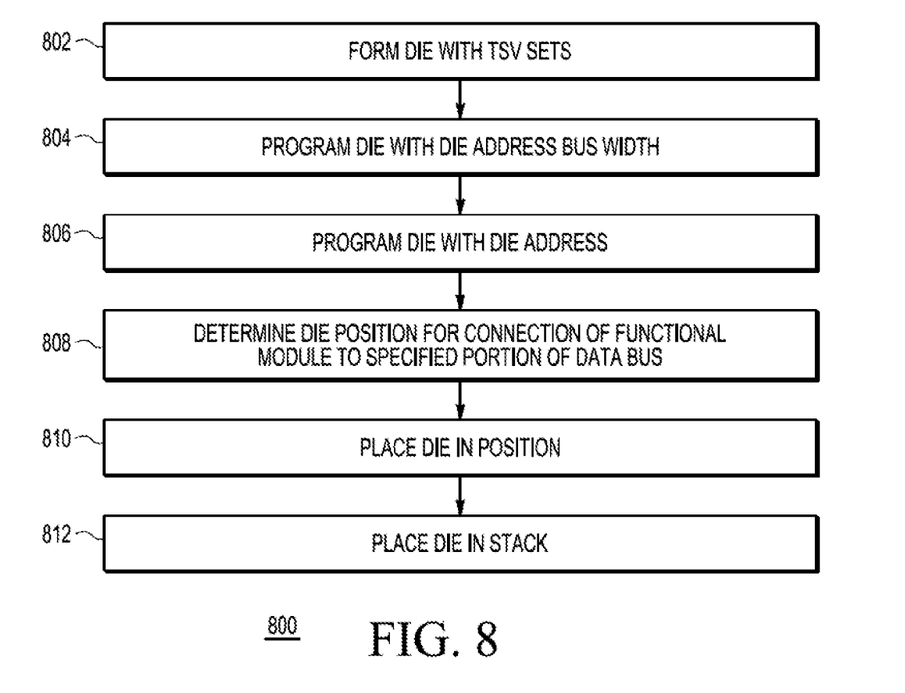
FIG. 8 is a flow diagram of a method of stacking dies in a stacked die IC and programming a die address bus width of the stacked die IC in accordance with at least one embodiment of the present disclosure.

FIG. 8 illustrates a flow diagram of a method 800 of forming a stacked die having a die address bus with a programmable width, in accordance with at least one embodiment of the present disclosure. At block 802, a die is formed to have a storage module (e.g., a set of fuses) to store a value indicating a width of a die bus address. The die is also formed to have a set of TSVs to form a part of the die address bus and sets of TSVs to form different portions, or sub-busses, of a data bus. In at least one embodiment, the die is formed so that different sets of TSVs for the different portions of the data bus are arranged in symmetrical positions about one or more centerlines of a top surface of the die, in similar fashion to that illustrated above in FIG. 3. In addition, the die is formed so that a functional module of the die is connected to only one of the different sets of TSVs that form different portions of the data bus.

At block 804, a die programming control module determines, based on a design file or other specification, a specified width of the die address bus for the die stack that is to include the die formed at block 802. The die programming control module programs the storage module of the die with a value indicating the specified width. At block 806, the die programming control module determines, based on the design file or other specification, the die address to be assigned to the die, and programs a storage module of the die with the specified address.

At block 808, a die positioner identifies, based on the design file or other specification, which portion of a data bus of the stacked die is to be connected to the functional module of the die formed at block 802. The die positioner determines, for the identified portion of the data bus, the position of the die so that the set of TSVs connected to the functional module are aligned with TSVs of other dies to form the identified portion. In at least one embodiment, the identified portion requires the die to be flipped about a centerline or rotated, as described above in the examples of FIGS. 4 and 5. At block 810, the die positioner places the die in the position identified at block 808, including by performing any necessary rotations of the die. At block 812 a die stacker stacks the positioned die on the die stack.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An integrated circuit device, comprising:
    a die address bus;
    a plurality of dies arranged in a stacked die integrated circuit, the plurality of dies comprising a first die including:
        a storage location configured to store information indicating a width of the die address bus; and
        an interface configured to receive a die address via the die address bus based on the information.

2. The integrated circuit device of claim 1, wherein the first die comprises:
    a first set of through-silicon vias (TSVs) forming a first portion of a data bus of the stacked die integrated circuit, the first set of TSVs coupled to a functional module of the first die; and
    a second set of TSVs forming a second portion of the data bus, the second set of TSVs not coupled to the functional module of the first die.

3. The integrated circuit device of claim 2, wherein the first set of TSVs and the second set of TSVs are disposed symmetrically about a first centerline of a face of the first die.

4. The integrated circuit device of claim 3, wherein the first die comprises:
    a third set of TSVs forming a third portion of the data bus of the stacked die integrated circuit, the third set of TSVs not coupled to a functional module of the first die; and
    wherein the third set of TSVs is disposed symmetrically with the first set of TSVs about a second centerline of the face of the first die.

5. The integrated circuit device of claim 4, wherein the first die comprises:
    a fourth set of TSVs forming a fourth portion of the data bus, the second set of TSVs not coupled to the functional module of the first die; and
    wherein the fourth set of TSVs is disposed symmetrically with the first set of TSVs about the first centerline and disposed symmetrically with the second set of TSVs about the second centerline of the face of the first die.

6. The integrated circuit device of claim 2, wherein plurality of dies comprises a second die, the second die comprising:
    a third set of TSVs aligned with the first set of TSVs forming the first portion of the data bus, the third set of TSVs not coupled to a functional module of the second die; and
    a fourth set of TSVs aligned with the second set of TSVs forming the second portion of the data bus, the fourth set of TSVs coupled to the functional module of the second die.

7. The integrated circuit device of claim 6, wherein the first die and the second die are programmed to have the same die address.

8. The integrated circuit device of claim 6, wherein the first die is stacked on the second die with the second die in a first position, and fourth set of TSVs is disposed such that the fourth set of TSVs align with the first set of TSVs when the first die is stacked on the second die with the second die in a flipped position relative to the first position.

9. The integrated circuit device of claim 1, wherein the interface is configured to select a number of signal lines of the die address bus based on the information indicating the width of the die address bus, and configured to identify the received die address by reading the selected signal lines.

10. An integrated circuit device, comprising:
   a plurality of stacked die comprising a first die and a second die; and
   a data bus having a width based on the first die being disposed on the stack in a first orientation of a plurality of possible orientations and the second die being disposed on the stack in a second orientation of the plurality of orientations.

11. An integrated circuit device, comprising:
   a die address bus;
   a plurality of dies arranged in a stacked die integrated circuit, each of the plurality of dies including:
      a storage location configured to store information indicating a width of the die address bus; and
      an interface configured to receive a die address via the die address bus and identify an address width of the die address based on the information.

* * * * *